(12) United States Patent  
Koroglu et al.

(10) Patent No.: US 8,781,428 B2
(45) Date of Patent: Jul. 15, 2014

(54) FREQUENCY SYNTHESIZER

(75) Inventors: Mustafa H. Koroglu, Austin, TX (US); Sherry X. Wu, Austin, TX (US); Ramin Khoini-Poorfard, Austin, TX (US); Alessandro Piovaccari, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 1096 days.

(21) Appl. No.: 12/715,728

(22) Filed: Mar. 2, 2010

(65) Prior Publication Data
US 2011/0215848 A1   Sep. 8, 2011

(51) Int. Cl.
*H04B 1/06* (2006.01)
*H03L 7/06* (2006.01)

(52) U.S. Cl.
CPC .................................... *H03L 7/06* (2013.01)
USPC ........... 455/260; 455/255; 455/257; 455/205; 455/121

(58) Field of Classification Search
USPC ......... 455/456, 255, 257, 260, 205, 121, 208, 455/126, 110; 327/157, 148, 156
See application file for complete search history.

(56) References Cited

U.S. PATENT DOCUMENTS

| | | | |
|---|---|---|---|
| 5,479,126 A * | 12/1995 | Pan et al. .................. 327/157 |
| 5,546,052 A * | 8/1996 | Austin et al. ............... 331/1 A |
| 5,734,279 A * | 3/1998 | Bereza ..................... 327/112 |
| 5,740,213 A * | 4/1998 | Dreyer ..................... 375/374 |
| 5,943,613 A * | 8/1999 | Wendelrup et al. ........ 455/343.1 |
| 5,945,855 A * | 8/1999 | Momtaz .................... 327/157 |
| 5,949,264 A * | 9/1999 | Lo ........................... 327/157 |
| 6,169,458 B1 * | 1/2001 | Shenoy et al. .............. 331/17 |
| 6,329,882 B1 * | 12/2001 | Fayneh et al. .............. 331/10 |
| 6,408,183 B1 * | 6/2002 | Woo ...................... 455/435.1 |
| 6,564,039 B1 * | 5/2003 | Meador et al. ............. 455/76 |
| 6,566,920 B1 * | 5/2003 | Kim ........................ 327/147 |
| 6,586,976 B2 * | 7/2003 | Yang ....................... 327/157 |
| 6,600,351 B2 * | 7/2003 | Bisanti et al. .............. 327/157 |
| 6,664,829 B1 * | 12/2003 | Hughes .................... 327/157 |
| 6,670,833 B2 * | 12/2003 | Kurd et al. ................ 327/156 |
| 6,677,824 B2 * | 1/2004 | Harpham ................... 331/17 |
| 6,781,424 B2 * | 8/2004 | Lee et al. ................. 327/113 |
| 6,993,300 B2 | 1/2006 | Luo et al. |
| 7,019,571 B2 * | 3/2006 | Lim ........................ 327/157 |
| 7,095,287 B2 * | 8/2006 | Maxim et al. .............. 331/44 |
| 7,230,504 B1 | 6/2007 | Marques et al. |
| 7,345,550 B2 * | 3/2008 | Bellaouar et al. ............ 331/17 |
| 2005/0052208 A1 * | 3/2005 | Starr ....................... 327/156 |
| 2007/0019760 A1 | 1/2007 | Maligeorgos et al. |

* cited by examiner

*Primary Examiner* — Temesgh Ghebretinsae
*Assistant Examiner* — Richard Chan
(74) *Attorney, Agent, or Firm* — Egan, Peterman & Enders LLP.

(57) ABSTRACT

A frequency synthesizer includes a controlled oscillator configured to extend a temperature range and phase noise of the synthesizer without compromising the frequency coverage of the synthesizer. The frequency synthesizer also includes bias generation circuitry that sets a bias current of a charge pump to reduce bandwidth variations of the synthesizer. The frequency synthesizer further includes switching circuitry to dynamically turn a charge pump on and off to reduce effects of current leakage in the charge pump.

24 Claims, 7 Drawing Sheets

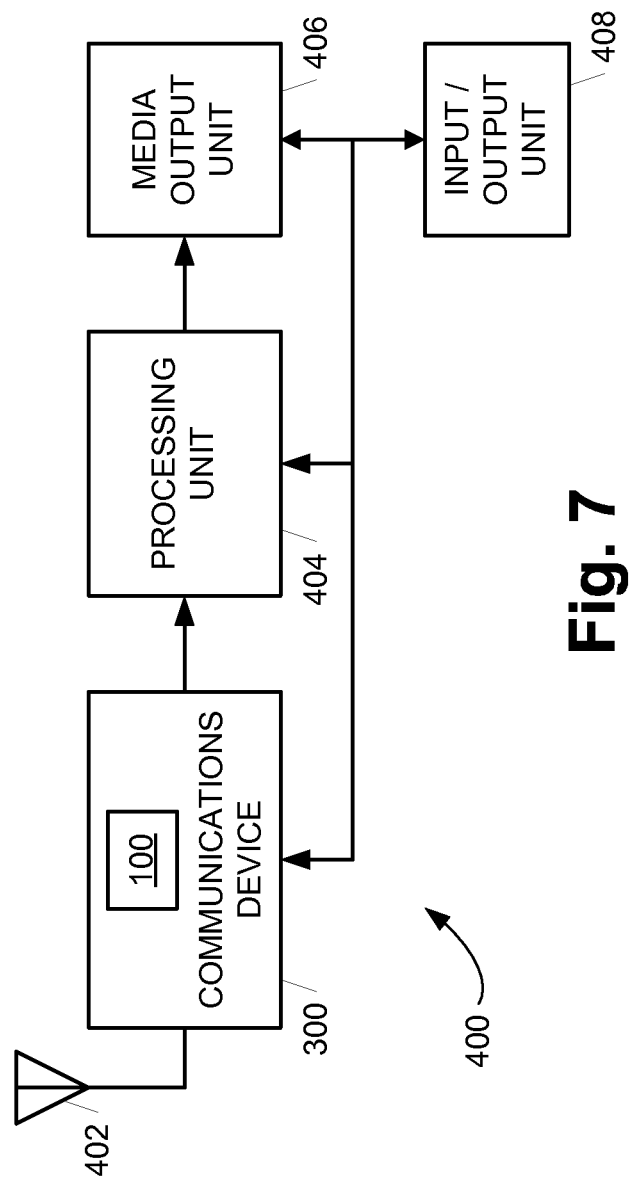

FREQUENCY SYNTHESIZER

BACKGROUND

A communication system typically includes a frequency synthesizer to allow the system to receive and/or transmit different frequencies. The frequency synthesizer generally includes a phase locked loop to set and maintain the desired frequency of a synthesizer. A phase locked loop includes components that include a phase detector, one or more charge pumps, one or more loop filters, and a controlled oscillator. These components each bring design challenges to be overcome so that a phase locked loop may minimize undesirable characteristics such as susceptibility to phase noise and reference spurs while maximizing desirable characteristics such as temperature range, frequency range, and bandwidth.

SUMMARY

According to one exemplary embodiment, a frequency synthesizer is provided. The frequency synthesizer includes a phase detector configured to detect a phase difference between a reference signal and a phase output signal, a first charge pump configured to supply first amount of charge responsive to the phase difference, a second charge pump configured to supply second amount of charge responsive to the phase difference, a direct path loop filter configured to generate a first filtered input responsive to the first amount of charge, an integrating path loop filter configured to generate a second filtered input responsive to the second amount of charge, and a controlled oscillator configured to generate the phase output signal by applying a first gain to the first filtered input and applying a second gain to the second filtered input, the second gain greater than the first gain.

According to another exemplary embodiment, a communications device is provided. The communications device includes local oscillator generation circuitry including a frequency synthesizer with a charge pump and bias circuitry. The bias circuitry is configured to set a bias current signal provided to the charge pump based on a calibrated resistor and a reference bias voltage, and the local oscillator generation circuitry configured to generate a mixing signal from a phase output signal generated by the frequency synthesizer. The communications device also includes communications circuitry configured to generate a digital signal from the analog input signal using the mixing signal and processing circuitry configured to generate the communications output signal responsive to the digital signal from the communications circuitry.

According to a further exemplary embodiment, a media system is provided. The media system includes a communications device configured to receive an analog input signal and generate a communications output signal and a processing unit configured to generate a media signal in response to the communications output signal from the communications device. The communications device includes local oscillator generation circuitry including a frequency synthesizer with a charge pump. The frequency synthesizer is configured to turn off the charge pump between comparisons of a phase reference signal and a phase output signal, and the local oscillator generation circuitry is configured to generate a mixing signal from the phase output signal. The communications device also includes communications circuitry configured to generate a digital signal from the analog input signal using the mixing signal and processing circuitry configured to generate the communications output signal responsive to the digital signal from the communications circuitry.

BRIEF DESCRIPTION OF THE DRAWINGS

FIG. 7 is a block diagram illustrating one embodiment of a media system that includes a communications device.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As described herein, a dual path phase locked loop frequency synthesizer is provided. The frequency synthesizer includes a controlled oscillator that applies a larger gain to an integrating path input than a gain applied to a direct path input to extend a temperature range of the synthesizer without compromising the frequency coverage and phase noise of the synthesizer. The frequency synthesizer also includes bias generation circuitry that sets a bias current of a charge pump to reduce bandwidth variations of the synthesizer. The frequency synthesizer further includes switching circuitry to dynamically turn a charge pump on and off to reduce effects of current leakage in the charge pump.

Figure 1:
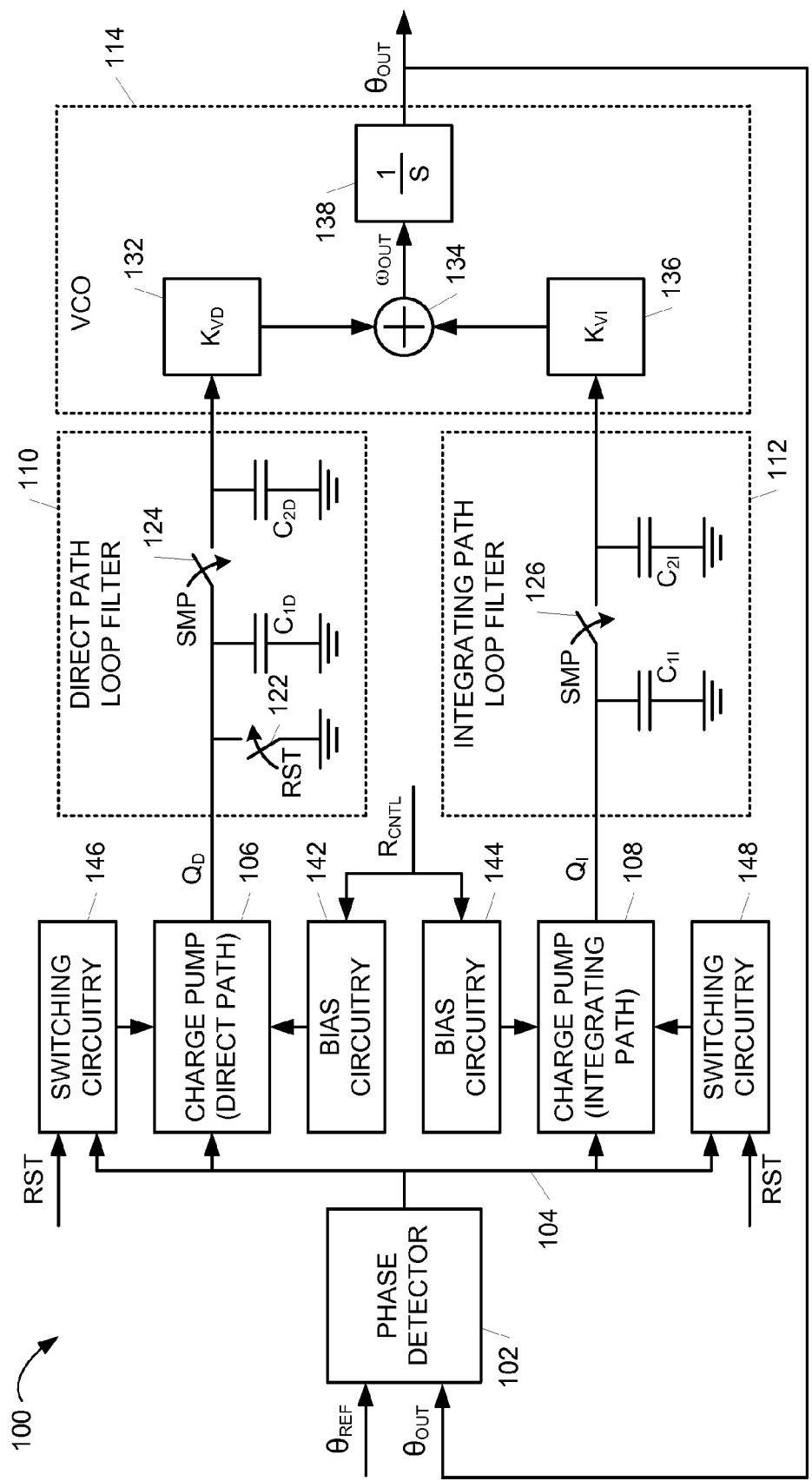
FIG. 1 is a schematic diagram illustrating one embodiment of a frequency synthesizer.

FIG. 1 is a schematic diagram illustrating one embodiment of a dual path phase locked loop (PLL) frequency synthesizer 100. Synthesizer 100 includes a phase detector 102, a direct path charge pump 106, an integrating path charge pump 108, a direct path loop filter 110, an integrating path loop filter 112, and a voltage controlled oscillator (VCO) 114. Synthesizer 100 also includes bias circuitries 142 and 144 that bias charge pumps 106 and 108, respectively, as described in additional detail below. Synthesizer 100 further includes switching circuitries 146 and 148 that dynamically turn charge pumps 106 and 108, respectively, on and off as described in additional detail.

Synthesizer 100 receives a phase reference signal, $\theta_{REF}$, at an input of phase detector 102 and generates a phase output signal, $\theta_{OUT}$, at an output of VCO 114. Synthesizer 100 feeds back the phase output signal from VCO 114 as an input to phase detector 102. Synthesizer 100 generates the phase output signal with the same phase as phase reference signal once loop lock is achieved. Accordingly, synthesizer 100 forms a phase locked loop.

Phase detector 102 generates a signal 104 based on a phase difference between the phase reference signal and the phase output signal. Signal 104 includes an up signal, which is shown as UP in FIG. 4, and a down signal which is shown as in the inverted down signal DN-bar in FIG. 4. Phase detector 102 generates the up signal with a logic high value when the phase output signal lags the phase reference signal and generates the down signal with a logic low value when the phase output signal leads the phase reference signal in one embodiment. Phase detector 102 provides signal 104 to charge pumps 106 and 108 and switching circuitries 146 and 148.

Charge pump 106 and loop filter 110 combine to form a direct path between phase detector 102 and VCO 114. Charge pump 106 supplies charge $Q_D$ to loop filter 110 responsive to signal 104. Charge pump 106 provides current to loop filter 110 to increase the amount of charge supplied to loop filter 110 when the up signal is at a logic high value. Charge pump 106 pulls current from loop filter 110 to decrease the amount of charge supplied to loop filter 110 when the down signal is at a logic low value.

In the embodiment shown in FIG. 1, direct path loop filter 110 is a resistor capacitor (RC) switched capacitor filter with a switched capacitor resistor, $C_{1D}$, (sample) and a capacitor, $C_{2D}$, (hold). In other embodiments, direct path loop filter 110 may be other suitable types of filters. The switched capacitor resistor $C_{1D}$ is coupled between the input of loop filter 110 and ground, and the capacitor $C_{2D}$ is coupled between the output of loop filter 110 and ground. A reset switch 122 is also coupled between the input of loop filter 110 and ground. Switch 122 opens responsive to a reset signal (RST) to allow charge to accumulate on switched capacitor resistor $C_{1D}$ and closes responsive to the reset signal to reset the charge on switched capacitor resistor $C_{1D}$ to zero or a relatively low value. A sampling switch 124 is coupled between the switched capacitor resistor $C_{1D}$ and the capacitor $C_{2D}$. Sampling switch 124 periodically closes responsive to a sampling signal (SMP) to provide charge from switched capacitor resistor $C_{1D}$ to capacitor $C_{2D}$ and opens responsive to the sampling signal to prevent charge from transferring from switched capacitor resistor $C_{1D}$ to capacitor $C_{2D}$. The voltage on capacitor $C_{2D}$ forms the output of direct path loop filter 110. Direct path loop filter 110 provides the output as a direct path filtered input to VCO 114.

Charge pump 108 and loop filter 112 combine to form an integrating path between phase detector 102 and VCO 114. Charge pump 108 supplies charge, $Q_I$, to loop filter 112 responsive to signal 104. Charge pump 108 provides current to loop filter 112 to increase the amount of charge supplied to loop filter 112 when the up signal is at a logic high value. Charge pump 108 pulls current from loop filter 112 to decrease the amount of charge supplied to loop filter 112 when the down signal is at a logic low value.

In the embodiment shown in FIG. 1, integrating path loop filter 112 is a switched capacitor filter with a switched capacitor, $C_{1I}$, (sample) and a capacitor, $C_{2I}$, (hold). In other embodiments, integrating path loop filter 112 may be other suitable types of filters. The switched capacitor resistor $C_{1I}$ is coupled between the input of loop filter 112 and ground, and the capacitor $C_{2I}$ is coupled between the output of loop filter 112 and ground. A sampling switch 126 is coupled between the switched capacitor resistor $C_{1I}$ and the capacitor $C_{2I}$. Sampling switch 126 periodically closes responsive to the sampling signal (SMP) to provide charge from switched capacitor resistor $C_{1I}$ to capacitor $C_{2I}$ and opens responsive to the sampling signal to prevent charge from transferring from switched capacitor resistor $C_{1I}$ to capacitor $C_{2I}$. The voltage on capacitor $C_{2I}$ forms the output of integrating path loop filter 112. Integrating path loop filter 112 provides the output as an integrating path filtered input to VCO 114.

VCO 114 receives the direct and integrating path filtered inputs from direct path loop filter 110 and integrating path loop filter 112, respectively. VCO 114 includes a gain block 132 that applies a constant gain of $K_{VD}$ to the direct path filtered input and provides the gained signal to summation circuitry 134. VCO 114 also includes a gain block 136 that applies a constant gain of $K_{VI}$ to the integrating path filtered input, where the gain $K_{VI}$ is greater than the gain $K_D$ as described in additional detail below, and provides the gained signal to summation circuitry 134. Summation circuitry 134 sums the gained signals from blocks 132 and 136 to generate a combined signal with an angular frequency of $\omega_{OUT}$. Summation circuitry 134 provides the combined signal to an integrator 138. Integrator 138 integrates the combined signal to generate the phase output signal. Integrator 138 outputs the phase output signal and feeds back the phase output signal to phase detector 102.

The direct and integrating path filtered inputs effectively form two control signals to VCO 114. The direct path filtered input is proportional to the output of phase detector 102, and the integrating path filtered input is an integrated version of the output of phase detector 102. As a result, the integrating path filtered input forms an integrating path control signal that sets the desired frequency of VCO 114 while the direct path filtered input forms a direct path control signal that makes higher frequency adjustments to the frequency of VCO 114 (e.g., phase noise shaping).

Because the direct path control signal corrects for relatively small signals during normal operation, the direct path control signal may be configured to cover a very small range without compromising the frequency coverage of synthesizer 100. In particular, the gain of $K_{VD}$ applied to the direct path control signal by gain block 132 may be configured to be smaller than the gain of $K_{VI}$ applied to the integrating path control signal by gain block 136. The reduction of the gain $K_{VD}$ may reduce the phase noise contribution of the direct path loop filter 110.

To allow synthesizer 100 to operate with a wide range of frequencies, the operational frequency range of VCO 114 is divided into sub-bands and a trimming algorithm is applied to VCO 114 for each sub-band. The gain $K_{VI}$ of gain block 136 is configured to be large enough to allow synthesizer 100 to cover with a wide range of frequencies with the sub-bands and large enough to allow synthesizer 100 to remain locked over an extended temperature range. The gain $K_{VD}$ is configured to be smaller than the gain $K_{VI}$ to mitigate the effects the phase noise of direct path loop filter 110 which is proportional to the gain $K_{VD}$. Meanwhile, the higher gain $K_{VI}$ extends the temperature coverage of synthesizer 100.

Figure 2:
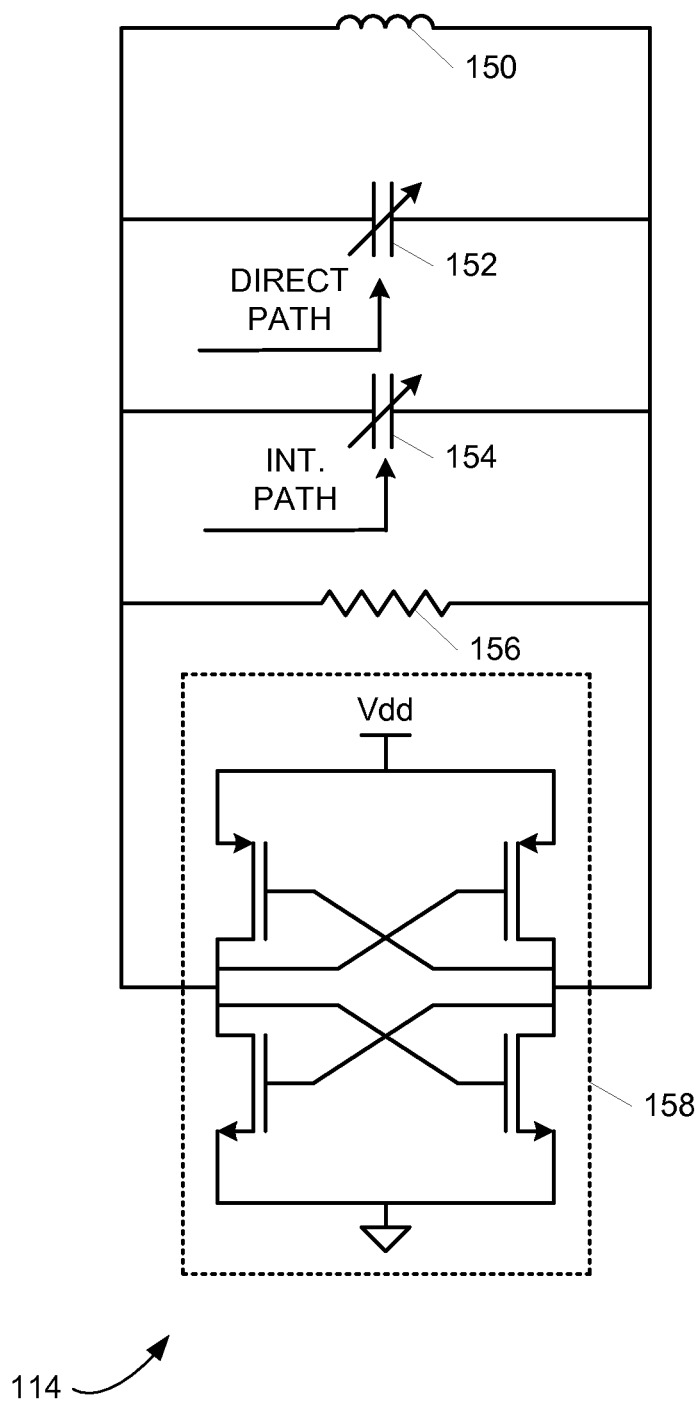
FIG. 2 is a circuit diagram illustrating one embodiment of a controlled oscillator.

FIG. 2 is a circuit diagram illustrating one embodiment of VCO 114. VCO 114 includes an inductor 150, varactors 152 and 154, a resistor 156 that represents the lossy component from inductor 150 and varactors 152 and 154, etc., and an amplifier 158 connected in parallel. VCO 114 oscillates at frequencies determined by the combination of inductance and capacitance provided by inductor 150 and varactors 152 and 154 (i.e., an LC tank), respectively. Amplifier 158 provides power to sustain the oscillations.

The direct path and integrating path control signals control the frequency of VCO 114. The direct path control signal adjusts a voltage provided to varactor 152 to adjust the capacitance of varactor 152, and the integrating path control signal adjusts a voltage provided to varactor 154 to adjust the capacitance of varactor 154. The gain $K_{VD}$ is generated by the combination of inductor 150 and varactor 152, and the gain $K_{VT}$, which is larger than the gain $K_{VD}$, is generated by the combination of inductor 150 and varactor 154.

Bias circuitry 142 is configured to allow bandwidth variations of synthesizer 100 caused by process variations in the manufacture of synthesizer 100 to be reduced. In particular, bias circuitry 142 sets bias current signals provided to charge pump 106 based on calibration values of resistive and capacitive (RC) components of synthesizer 100 and a reference bias voltage $V_{BG}$ (shown in FIG. 4).

In operation, the values of the RC components of synthesizer 100 may vary as much as +/−20% from the nominal values. A calibration may be performed on these components or other similar components on an integrated circuit that includes synthesizer 100 to determine the amount of variation from the nominal values, i.e., the calibration values. In one embodiment where synthesizer 100 is included in a communications device, such as a communications device 300 shown in FIG. 6 and described in additional detail below, an RC calibration may be performed to center an intermediate frequency (IF) filter response to improve the blocking performance of the communications device and thereby determine the calibration values of the RC components. The calibration values are applied to resistive components, i.e., a variable resistor $R_{CAL}$, of bias circuitry 142 shown in FIG. 4. In other embodiments, synthesizer 100 may access or be provided with other calibration values or information in other suitable ways.

Figure 3A:
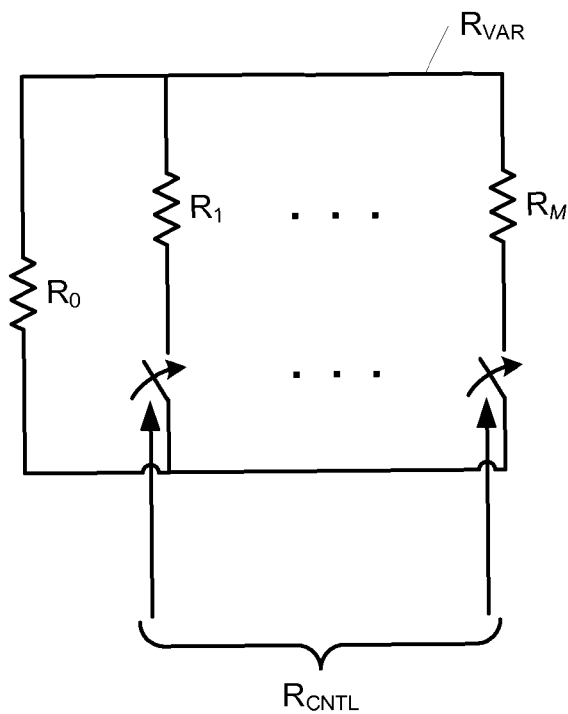
FIGS. 3A-3B are circuit diagrams illustrating embodiments of variable circuitries.
Figure 3B:
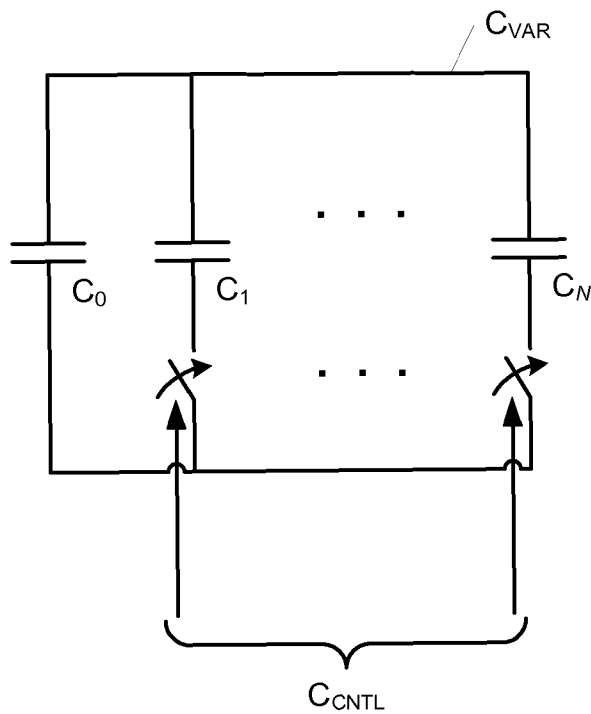

FIG. 3A is a circuit diagram illustrating one embodiment of a variable resistor circuit $R_{VAR}$ that may be used in conjunction with calibration values, and FIG. 3B is a circuit diagram illustrating one embodiment of a variable capacitor circuit $C_{VAR}$ that may be used in conjunction with calibration values. The variable resistor circuit has a nominal resistor value of $R_0$ and is adjusted by a control signal $R_{CNTL}$ that selectively opens or closes switches that connect resistors $R_1$ to $R_M$, where M is an integer that is greater than or equal to two, in parallel with resistor $R_0$. Similarly, the variable capacitor circuit has a nominal capacitor value of $C_0$ and is adjusted by a control signal $C_{CNTL}$ that selectively opens or closes switches that connect capacitors $C_1$ to $C_N$, where N is an integer that is greater than or equal to two, in parallel with capacitor $C_0$.

Figure 4:
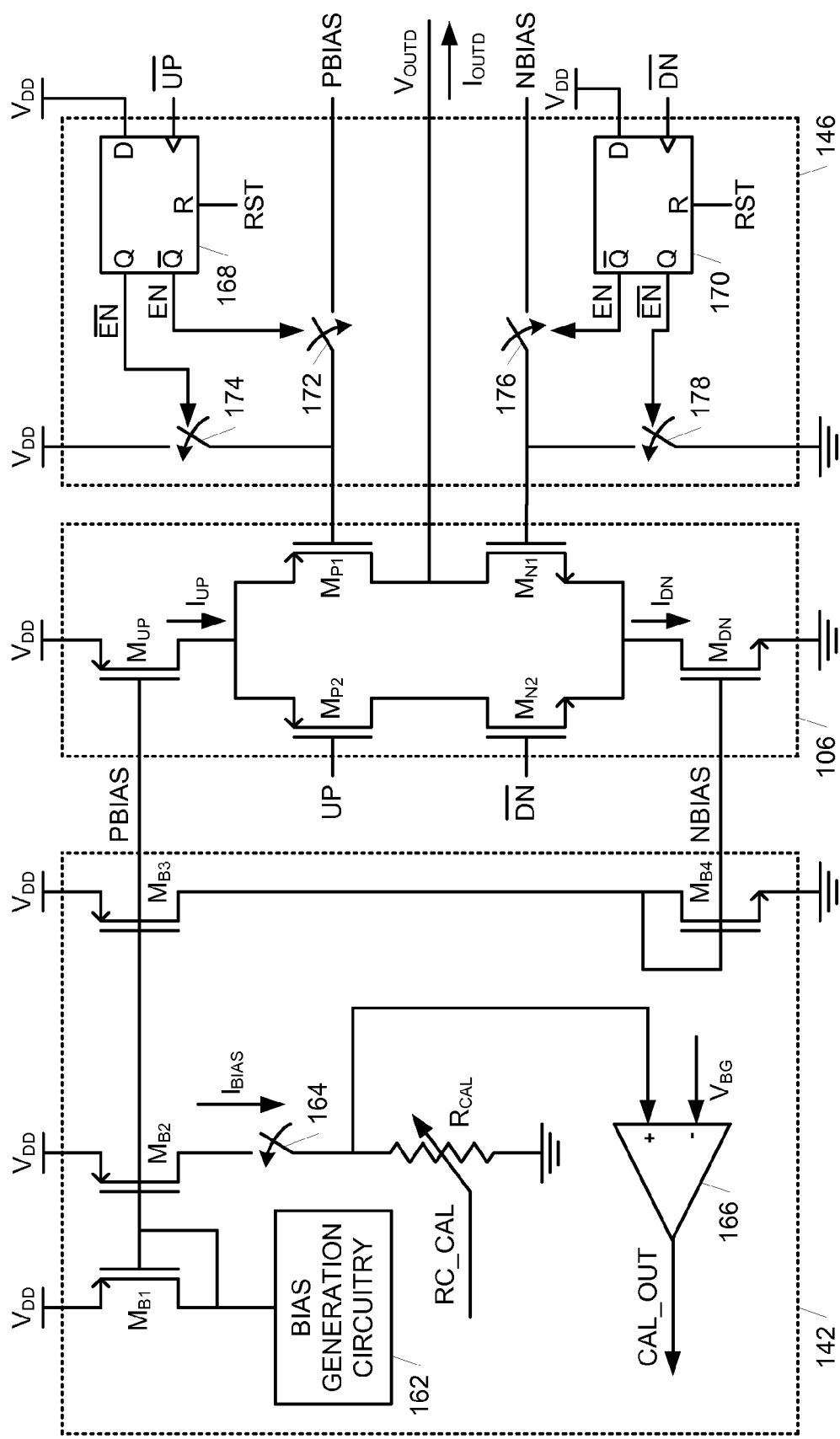
FIG. 4 is a circuit diagram illustrating one embodiment of selected portions of a frequency synthesizer.

FIG. 4 is a circuit diagram illustrating one embodiment of selected portions of synthesizer 100. In the embodiment of FIG. 4, bias circuitry 142 includes bias generation circuitry 162 configured to generate and provide bias current signals PBIAS and NBIAS to charge pump 106. Bias circuitry 142 also includes a variable resistor $R_{CAL}$ that is set by a calibration signal RC_CAL based on the calibration values. After the value of $R_{CAL}$ is set, a switch 164 is closed to direct a bias current $I_{BIAS}$ set by bias generation circuitry 162 through the variable resistor $R_{CAL}$. Bias generation circuitry 162 increases the bias current $I_{BIAS}$ until a calibration output signal CAL_OUT of a comparator 166 indicates that the voltage across the variable resistor $R_{CAL}$ is equal to or exceeds the reference voltage $V_{BG}$. Bias generation circuitry 162 sets the bias current $I_{BIAS}$ to the value that causes the voltage across the variable resistor $R_{CAL}$ to equal or exceed the reference voltage $V_{BG}$ and opens switch 164.

Bias current signals PBIAS and NBIAS control the amount of up and down current $I_{UP}$ and $I_{DN}$, respectively, generated by transistors $M_{UP}$ and $M_{DN}$, respectively, of charge pump 106. Bias current signals PBIAS and NBIAS and the up and down signals combine to generate the output current $I_{OUTD}$ of direct path charge pump 106 using transistors $M_{P1}$, $M_{P2}$, $M_{N1}$, and $M_{N2}$.

Bias circuitry 142 reduces the bandwidth variations of synthesizer 100 as follows. The bandwidth (BW) of synthesizer 100 may be determined using Equation I where $T_{REF}$ is the inverted reference frequency of synthesizer 100.

$$BW = \frac{1}{2\pi} * I_{OUTD} * \frac{T_{REF}}{C_{1D}} * K_{VD} \quad \text{Equation I}$$

As shown in FIG. 4, the output current $I_{OUTD}$ is proportional to the bias current $I_{BIAS}$ set by bias generation circuitry 162 which is equal to $V_{BG}/R_{CAL}$. Accordingly, the bandwidth is proportional to the bias current $I_{BIAS}$ as shown in Equation II.

$$BW\alpha = \frac{1}{2\pi} * \frac{V_{BG}}{R_{CAL}C_{1D}} * T_{REF} * K_{VD} \quad \text{Equation II}$$

$R_{CAL}$ is inversely proportional to the RC time constant as shown in Equation III where $R_0$ is the nominal value of the variable resistor.

$$R_{CAL} = \frac{R_0}{RC\_CAL} \quad \text{Equation III}$$

Equation III substitutes into Equation II along with a proportionality constant k to generate Equation IV.

$$BW = \frac{1}{2\pi} * k * \frac{RC\_CAL}{R_0} * \frac{V_{BG}}{C_{1D}} * T_{REF} * K_{VD} \quad \text{Equation IV}$$

Because the process variations of the variable resistor $R_{CAL}$ tracks the process variations of the resistive and capacitive components of charge pump 106 closely, RC variation is effectively removed from the bandwidth equation. Accordingly, bias circuitry 142 reduces the bandwidth variations of synthesizer 100 by setting bias current signals provided to charge pump 106 based on the calibration value of calibration resistor $R_{CAL}$ and the reference bias voltage $V_{BG}$.

Bias circuitry 144 may be configured similarly to the embodiment of bias circuitry 142 shown in FIG. 4 in one embodiment to further reduce the bandwidth variations of synthesizer 100.

Switching circuitry 146 is configured to prevent current leakage and allow for large voltage swings of VCO 114 by dynamically turning charge pump 106 on and off. In the operation of charge pump 106, high levels of the output voltage $V_{OUT}$ may cause transistor $M_{P1}$ to conduct current and allow current leakage. The current leakage may cause spurs and voltage supply sensitivity on the supply voltage $V_{DD}$ that adversely impact the performance of synthesizer 100.

Because synthesizer 100 operates with a low reference frequency, charge pump 106 is used for a small fraction of the total period which occurs after a comparison between the phase reference signal and the output of VCO 114 is made by phase detector 102. Accordingly, switching circuitry 146 is configured to turn off charge pump 106 between comparisons of the phase reference signal and the output of VCO 114 by phase detector 102.

As shown in the embodiment of FIG. 4, switching circuitry 146 includes D flip-flops 168 and 170. D flip-flop 168 opens and closes switches 172 and 174 based on the reset signal (RST) and the inverted up signal to alternately connect transistor $M_{P1}$ to the bias current signal PBIAS and the supply voltage. Similarly, D flip-flop 170 opens and closes switches 176 and 178 based on the reset signal (RST) and the inverted down signal to alternately connect transistor $M_{N1}$ to the bias current signal NBIAS and ground. By doing so, switching circuitry 146 turns off charge pump 106 between the comparisons of phase detector 102 by turning off transistors $M_{P1}$ and $M_{N1}$. When turned off, charge pump 106 is disabled such that charge pump 106 does not provide charge on the charge pump output to direct path loop filter 110 and prevents current leakage though the supply voltage.

Figure 5:
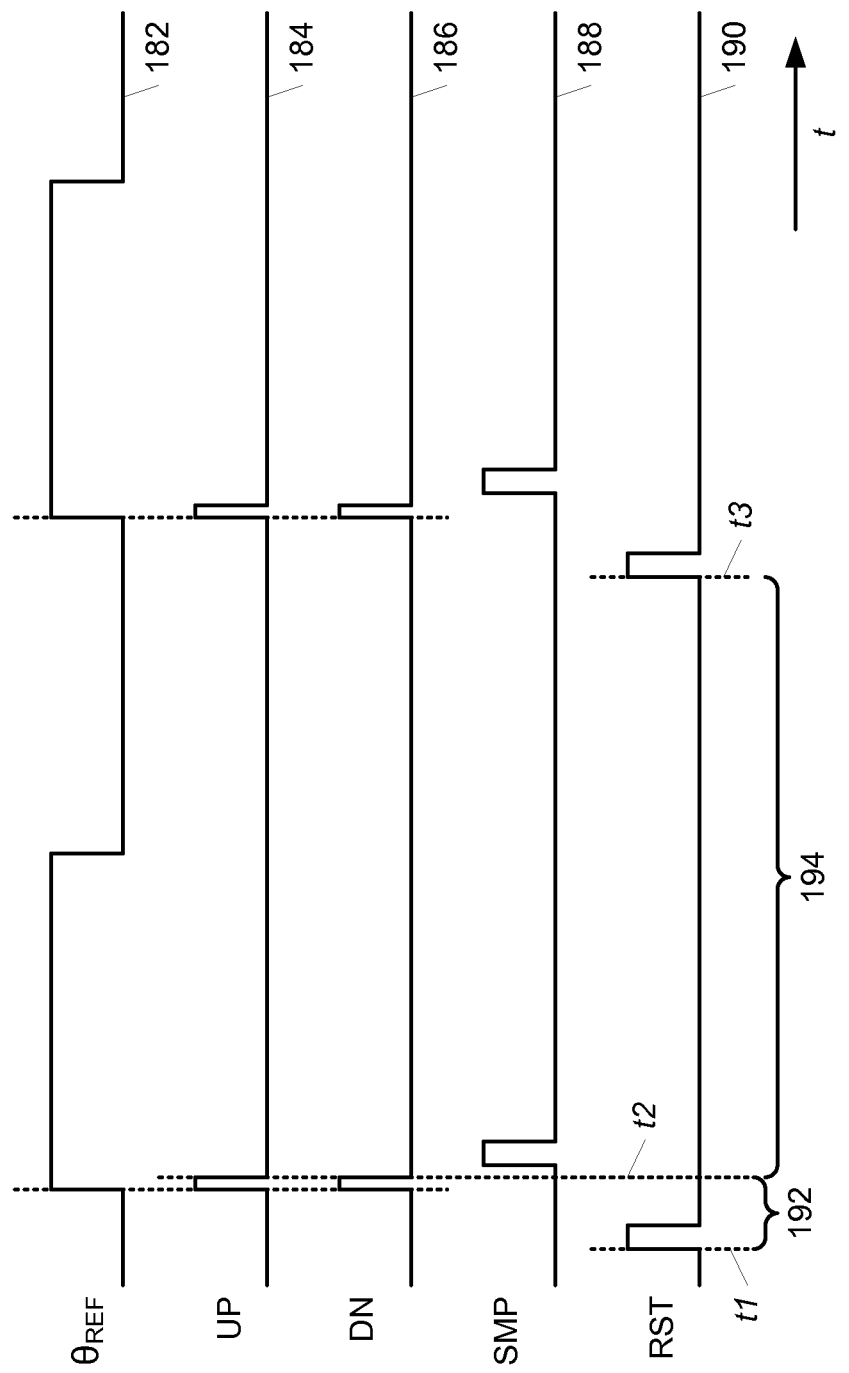
FIG. 5 is a timing diagram illustrating the operation of one embodiment of a frequency synthesizer.

FIG. 5 is a timing diagram 180 illustrating the operation of one embodiment of frequency synthesizer 100. Timing diagram 180 includes the phase reference signal 182, the up signal 184, the down signal 186, the sample signal 188, and the reset signal 190. Switching circuitry 146 turns on charge pump 106 during a time period 192 defined by the rising edge of the reset signal at a time t1 until just after the falling edges of the up and down signals at a time t2. Switching circuitry 146 turns off charge pump 106 during a time period 194 defined by just after the falling edges of the up and down signals at time t2 until the rising edge of the reset signal at a time t3.

Figure 6:
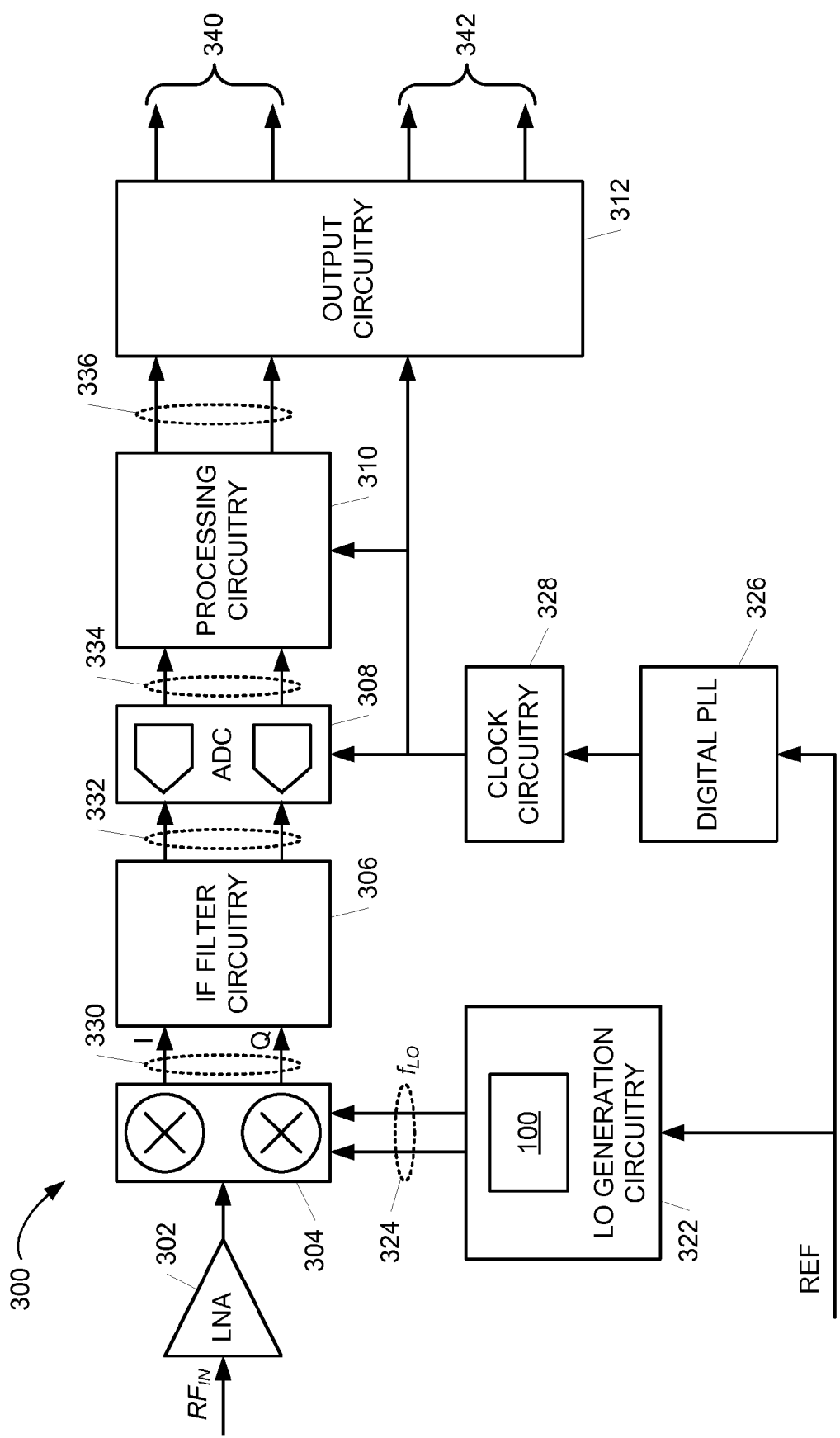
FIG. 6 is a block diagram illustrating one embodiment of selected portions of a communications device.

Switching circuitry 148 may be configured similarly to the embodiment of switching circuitry 146 shown in FIG. 4 in one embodiment to prevent current leakage in charge pump 108 and allow for large voltage swings of VCO 114. Synthesizer 100 may be used with respect to a wide variety of communications systems. In one embodiment, synthesizer 100 may be configured for use in intermediate frequency applications as shown in FIG. 6. FIG. 6 is a block diagram illustrating one embodiment of selected portions of a low intermediate frequency (low-IF) receiver 300 with synthesizer 100. Receiver 300 includes a low noise amplifier (LNA) 302, a mixer 304, low intermediate frequency (IF) filter circuitry 306, ADC circuitry 308, processing circuitry 310, output circuitry 312, local oscillator (LO) generation circuitry 322 with synthesizer 100, a digital PLL 326, and clock circuitry 328.

Receiver 300 is configured to receive a radio-frequency (RF) signal ($RF_{IN}$) and process the RF signal to generate a digital audio and/or video media output 340 and/or an analog audio and/or video media output 342. Receiver 300 forms an integrated terrestrial or cable broadcast receiver configured to receive RF signals. As used herein, an RF signal means an electrical signal conveying useful information and having a frequency from about 3 kilohertz (kHz) to thousands of gigahertz (GHz), regardless of the medium through which the signal is conveyed. Thus, an RF signal may be transmitted through air, free space, coaxial cable, and/or fiber optic cable, for example. Accordingly, receiver 300 may receive the RF signal from a wired or wireless medium. In other embodiments, receiver 300 may be configured to receive signals in another suitable frequency range.

LNA 302 receives the RF signal and generates an amplified output signal. The output of LNA 302 is then applied to mixer 304, and mixer 304 generates in-phase (I) and quadrature (Q) output signals, as represented by signals 330. To generate low-IF signals 330, mixer 304 uses phase shifted local oscillator (LO) mixing signals 324. LO generation circuitry 324 includes synthesizer 100, generates two out-of-phase LO mixing signals 324 from a reference signal (REF), and outputs LO mixing signals 324 to mixer 304. The outputs of mixer 304 are at a low-IF which may be fixed or designed to vary, for example, if discrete step tuning is used for LO generation circuitry 322.

Low-IF filter circuitry 306 receives the in-phase (I) and quadrature (Q) signals 330 and outputs in-phase and quadrature analog signals, as represented by signals 332. Low-IF filter circuitry 306 provides, in part, signal gain and signal filtering functions. Mixer 304 mixes the target channel within the input signal spectrum down to an IF. The IF frequency may be fixed at a particular frequency or may vary within a low-IF ranges of frequencies, depending upon the LO generation circuitry utilized and how it is controlled. Low-IF filter circuitry 306 provides signals 332 to ADC circuitry 308.

ADC circuitry 308 converts the in-phase (I) and quadrature (Q) signals to the digital domain using a clock signal from clock circuitry 328 and provides digital in-phase (I) and quadrature (Q) signals 334 to processing circuitry 310. Digital PLL 326 generates a phase-locked signal from the reference signal and outputs the phase-locked signal to clock circuitry 328. Clock circuitry 328 generates clock signals from the phase-locked signal and provides the clock signals ADC circuitry 308, processing circuitry 310, and output circuitry 312.

Processing circuitry 310 performs digital filtering and digital signal processing to further tune and extract the signal information from digital signals 334. Processing circuitry 310 produces baseband digital media signals 336. When the input signals relate to analog television broadcasts, the digital processing provided by processing circuitry 310 may include, for example, analog television demodulation. Processing circuitry 310 provides baseband digital media signals 336 to output circuitry 312.

Output circuitry 312 outputs baseband digital media signals 336 as digital media output signals 340 in any suitable digital format such as an IF I/Q format (e.g., LIF or ZIF I/Q). Output circuitry 312 may also convert the baseband digital media signals 336 into analog media output signals 342 in any suitable analog format such as CVBS and/or SIF/AF.

FIG. 7 is a block diagram illustrating one embodiment of a media system 400 that includes communications device 300 with synthesizer 100 as shown in FIG. 6. Media system 400 may be any type of portable or non-portable system configured to provide a media output, such as a mobile or cellular telephone, a personal digital assistant (PDA), an audio and/or video player (e.g., an MP3 or DVD player), and a notebook or laptop computer.

Media system 400 includes communications device 300 that receives a media transmission from an antenna 402 or other suitable input and provides a digital and/or analog media signal to a processing unit 404. Processing unit 404 performs any suitable processing on the media signal (e.g., television demodulation on a digital baseband signal) and provides the processed signal to a media output unit 406 for output to a user. Processing unit 404 may be omitted in some embodiments such that the media signal from communications device 300 may be provided directly to media output unit 406 in these embodiments. Media output unit 406 may include any suitable type and/or combination of audio and/or video output devices such as a television, a monitor, a display screen, a speaker, or headphones.

An input/output unit 408 receives inputs from a user and provides the inputs to communications device 300, processing unit 404, and/or media output device 406. Input/output unit 408 also receives outputs from communications device 300, processing unit 404, and/or media output device 406 and provides the outputs to a user. The inputs and outputs may include voice and/or data communications, audio, video, image, and/or other graphical information. Input/output unit 408 includes any number and types of input and/or output devices to allow a user provide inputs to and receive outputs from media system 400. Examples of input and output devices include a microphone, a speaker, a keypad, a pointing or selecting device, and a display device.

In the above embodiments, a variety of circuit and process technologies and materials may be used to implement the circuitries, devices, and systems. Examples of such technologies include metal oxide semiconductor (MOS), p-type MOS (PMOS), n-type MOS (NMOS), complementary MOS (CMOS), silicon-germanium (SiGe), gallium-arsenide (GaAs), silicon-on-insulator (SOI), bipolar junction transistors (BJTs), and a combination of BJTs and CMOS (BiCMOS). In addition, components of synthesizer 100, communications device 300, and/or communications 400 may be formed on the same semiconductor integrated circuit (i.e., integrated on a single chip that is formed on a common substrate) in some embodiments. In other embodiments, components of synthesizer 100, communications device 300, and/or communications 400 may be formed on different semiconductor integrated circuits or formed using another suitable type and/or combination of circuit technologies. Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A frequency synthesizer comprising:
   a phase detector configured to detect a phase difference between a reference signal and a phase output signal;
   a first charge pump configured to supply first amount of charge responsive to the phase difference;
   a second charge pump configured to supply second amount of charge responsive to the phase difference;
   a direct path loop filter configured to generate a first filtered input responsive to the first amount of charge;
   an integrating path loop filter configured to generate a second filtered input responsive to the second amount of charge; and
   a controlled oscillator configured to generate the phase output signal by applying a first gain to the first filtered input and applying a second gain to the second filtered input, the second gain greater than the first gain;
   wherein the first gain is configured to mitigate the effects of phase noise generated by the direct path loop filter, and wherein the second gain is configured to extend the temperature coverage of the frequency synthesizer.

2. The frequency synthesizer of claim 1 wherein the first filtered input forms a direct path control signal that makes higher frequency adjustments to a frequency of the phase output signal, and wherein the second filtered input forms an integrating path control signal that sets the frequency of the phase output signal.

3. The frequency synthesizer of claim 1 wherein the controlled oscillator includes a first varactor configured to form a portion of the first gain applied to the first filtered input, and wherein the controlled oscillator includes a second varactor configured to form a portion of the second gain applied to the second filtered input.

4. The frequency synthesizer of claim 1 further comprising:
   bias generation circuitry, the charge pump being coupled between the bias generation circuitry and the filter; where the bias generation circuitry is configured to set a bias current signal provided to the charge pump based on a calibrated resistor and a reference bias voltage.

5. The frequency synthesizer of claim 1 further comprising:
   switching circuitry configured to turn off the first charge pump between comparisons of the phase reference signal and the phase output signal by the phase detector.

6. A communications device comprising: local oscillator generation circuitry including a frequency synthesizer with a charge pump and bias circuitry, the bias circuitry comprising a calibrated resistor and being configured to set a bias current signal provided to the charge pump based on the calibrated resistor and a reference bias voltage, the local oscillator generation circuitry configured to generate a mixing signal from a phase output signal generated by the frequency synthesizer;
   communications circuitry configured to generate a digital signal from an analog input signal using the mixing signal; and
   processing circuitry configured to generate a communications output signal responsive to the digital signal from the communications circuitry.

7. The communications device of claim 6 wherein the bias circuitry is configured to set the bias current signal to a level that generates a calibrated voltage across the calibrated resistor that approximates the reference bias voltage.

8. The communications device of claim 6 wherein the calibrated resistor is set to a calibration value determined by an RC calibration.

9. The communications device of claim 6 wherein the frequency synthesizer includes a direct path with the charge pump, an integrating path, and a controlled oscillator, wherein the controlled oscillator is configured to generate the phase output signal by applying a first gain to a first filtered input from the direct path and applying a second gain to a second filtered input from the integrating path, and wherein the second gain is greater than the first gain.

10. The communications device of claim 6 wherein the frequency synthesizer includes switching circuitry configured to turn off the charge pump between comparisons of a phase reference signal and the phase output signal.

11. A media system comprising: a communications device configured to receive an analog input signal and generate a communications output signal, the communications device includes:
    local oscillator generation circuitry including a frequency synthesizer with a charge pump having a charge pump output coupled to provide a charge from the charge pump output to an input of a loop filter when the charge pump is turned on, the frequency synthesizer configured to turn off the charge pump between comparisons of a phase reference signal and a phase output signal such that the charge pump does not provide charge from the charge pump output to the input of the loop filter, the local oscillator generation circuitry configured to generate a mixing signal from the phase output signal;
    communications circuitry configured to generate a digital signal from the analog input signal using the mixing signal;
    processing circuitry configured to generate the communications output signal responsive to the digital signal from the communications circuitry; and
    a processing unit configured to generate a media signal in response to the communications output signal from the communications device.

12. The media system of claim 11 wherein the frequency synthesizer is configured to turn on the charge pump to provide charge on the charge pump output to the input of the loop filter based on the comparisons of the phase reference signal and the phase output signal.

13. The media system of claim 11 wherein the charge pump does not provide charge to the input of the loop filter when the charge pump is turned off.

14. The media system of claim 11 wherein the frequency synthesizer prevents current leakage through the charge pump when the charge pump is turned off.

15. The media system of claim 11 wherein the communications device includes a loop filter controlled in part by a reset signal, and wherein the frequency synthesizer is configured to turn off the charge pump based on the reset signal.

16. A media system comprising: a communications device configured to receive an analog input signal and generate a communications output signal, the communications device includes:
   local oscillator generation circuitry including a frequency synthesizer with a charge pump, the frequency synthesizer configured to turn off the charge pump between comparisons of a phase reference signal and a phase output signal, the local oscillator generation circuitry configured to generate a mixing signal from the phase output signal;
   communications circuitry configured to generate a digital signal from the analog input signal using the mixing signal;
   processing circuitry configured to generate the communications output signal responsive to the digital signal from the communications circuitry; and
   a processing unit configured to generate a media signal in response to the communications output signal from the communications device;
   wherein the frequency synthesizer includes bias generation circuitry configured to set a bias current signal provided to the charge pump based on a calibrated resistor and a reference bias voltage.

17. The media system of claim 11 further comprising:
   a media output device configured to generate a media output in response to the media signal from the processing circuitry.

18. The media system of claim 11 further comprising:
   an input/output unit configured to provide a control signal to the media output device.

19. The media system of claim 11 wherein the frequency synthesizer includes a direct path with the charge pump, an integrating path, and a controlled oscillator, wherein the controlled oscillator is configured to generate the phase output signal by applying a first gain to a first filtered input from the direct path and applying a second gain to a second filtered input from the integrating path, and wherein the second gain is greater than the first gain.

20. The frequency synthesizer of claim 1, where the controlled oscillator operates with a range of frequencies divided into sub-bands; where the second gain is configured to be sufficiently larger relative to the first gain to allow the frequency synthesizer to cover a range of frequencies with the sub-bands and to allow the synthesizer to remain locked over range of temperatures in order to extend an operational temperature range of the frequency synthesizer without decreasing the operational frequency range of the frequency synthesizer; and where the first gain is configured to be sufficiently smaller relative to the second gain to mitigate the effects of phase noise in the direct path loop filter that is proportional to the first gain.

21. The communications device of claim 6, where the bias circuitry is configured to set the bias current signal provided to the charge pump to reduce bandwidth variation of the frequency synthesizer.

22. A frequency synthesizer comprising:
   a phase detector configured to detect a phase difference between a reference signal and a phase output signal;
   a charge pump configured to supply an amount of charge responsive to the phase difference;
   a loop filter configured to generate a first filtered input responsive to the amount of charge;
   a controlled oscillator configured to generate the phase output signal by applying a gain to the filtered input; and
   bias generation circuitry separate from the loop filter, the bias generation circuitry being configured to set a bias current signal provided to the charge pump based on a calibrated resistor and a reference bias voltage.

23. A frequency synthesizer comprising:
   a phase detector configured to detect a phase difference between a reference signal and a phase output signal;
   a charge pump configured to supply an amount of charge responsive to the phase difference;
   a loop filter configured to receive the amount of charge from the charge pump and to generate a first filtered input responsive to the amount of charge received from the charge pump;
   a controlled oscillator configured to generate the phase output signal by applying a gain to the filtered input; and
   switching circuitry configured to turn off the charge pump between comparisons of the phase reference signal and the phase output signal by the phase detector.

24. A frequency synthesizer comprising:
   a phase detector configured to detect a phase difference between a reference signal and a phase output signal;
   a charge pump configured to supply an amount of charge responsive to the phase difference;
   a loop filter configured to generate a first filtered input responsive to the amount of charge;
   a controlled oscillator configured to generate the phase output signal by applying a gain to the filtered input; and
   switching circuitry configured to turn off the charge pump between comparisons of the phase reference signal and the phase output signal by the phase detector;
   where the switching circuitry comprises one or more D flip-flops that open and close one or more switches to alternately disconnect and connect the charge pump to a supply voltage to turn off the charge pump between comparisons of the phase reference signal and the phase output signal by the phase detector such that when the charge pump is turned off the charge pump does not provide charge to the loop filter and leakage through the charge pump is prevented.

* * * * *